United States Patent [19]
Ackland et al.

[11] Patent Number: 5,604,705
[45] Date of Patent: Feb. 18, 1997

[54] STATIC RANDOM ACCESS MEMORY SENSE AMPLIFIER

[75] Inventors: Bryan D. Ackland, Old Bridge; Jay H. O'Neill, Freehold, both of N.J.

[73] Assignee: Lucent Technologies Inc., Murray Hill, N.J.

[21] Appl. No.: 518,055

[22] Filed: Aug. 22, 1995

[51] Int. Cl.[6] ................................................. G11C 7/06
[52] U.S. Cl. ........................ 365/205; 365/190; 365/203; 365/207
[58] Field of Search .................................. 365/205, 202, 365/203, 204, 207, 190

[56] References Cited

U.S. PATENT DOCUMENTS

| | | | |
|---|---|---|---|
| 5,297,092 | 3/1994 | Johnson | 365/203 |
| 5,309,395 | 5/1994 | Dickenson et al. | 365/189.04 |
| 5,467,312 | 11/1995 | Albon et al. | 365/203 |
| 5,485,430 | 1/1996 | McClure | 365/203 |

Primary Examiner—Tan T. Nguyen

[57] ABSTRACT

A memory sense amplifier for a static random access memory includes a pair of transistor amplifiers respective to the bit lines threading the memory. The power consumed is minimized without sacrificing speed of operation by temporarily connecting the source electrodes of the transistor amplifiers to the bit lines to allow them to track the states of the bit lines before a current path is completed to the drains of the transistors to allow them to draw current from the bit lines, thereby minimizing the time that the sense amplifiers are permitted to draw current from the bit lines. In addition, an economy of circuitry is achieved by eliminating the need for a separate latch circuit by disconnecting the sense amplifiers from the bit lines and thereafter enabling them to latch the information state read from the bit lines. The memory cycle is defined in four distinct phases ("PRE-CHARGE", "SENSE", "SELECT", and "HOLD"), instead of in two phases ("clock" and "select") followed by indeterminate length self-timed intervals as provided in prior art U.S. Pat. No. 5,309,395.

16 Claims, 3 Drawing Sheets

STATIC RANDOM ACCESS MEMORY SENSE AMPLIFIER

FIELD OF THE INVENTION

This invention relates to circuitry for ascertaining the state of memory cells and, more particularly, to a transistor circuit which draws very little power.

BACKGROUND OF THE INVENTION

The need for a fast-acting circuit for reading data from and writing data into the memory cells, in particular, those that buffer packet data is described briefly in U.S. Pat. No. 5,309,395 issued May 3, 1994 entitled "Synchronous Static Random Access Memory". The '395 patent solved the speed problem by providing circuitry for reading lo from and writing into a memory unit in a single memory cycle. The circuitry included a precharge circuit, a pair of cross-coupled sense amplifiers, a latch generator, a read latch and a write circuit. As shown in FIG. 5 of the '395 patent, during a first half-cycle, ($t_0$–$t_1$), of a clock defining the memory cycle, a precharge circuit charged a pair of 0-bit and 1-bit lines threading through the memory array at the same time the sense amplifiers were clamped to produce a balanced output. At the end of the first half-cycle the precharging of the bit lines terminated. During the second half-cycle of the clock, a word was selected in the memory and a path was completed to allow the sense amplifiers to draw current from the bit lines. After a self-timed delay, ($t_1$–$t_2$) provided by analog circuit elements, the clamping of the sense amplifiers was removed allowing the amplifiers to follow the voltage changes on the bit lines as determined by the stored binary information state of the selected word. During this interval, cross-coupling between the amplifiers provides positive feedback which rapidly amplifies the small voltage difference on the bit lines into complimentary logic states on the outputs of the sense amplifiers. During the final interval, ($t_3$–$t_4$), the sense amplifiers generate a signal to latch the data read out and to allow new data to be written into the memory cells. It was the provision of a common latch signal to the read latch circuit and to the write circuit that enabled the circuit of the '395 patent to perform both a read and a write operation on a memory cell within a single half-cycle of the memory clock. A stated advantage of the '395 patent circuitry was that its regeneratively cross-coupled amplifiers only slightly discharged the bit lines during a read operation and thereafter drew only negligible current from the bit lines once the contents of the memory cells had been read. Leaving the bit lines close to the supply potential facilitated the rapid precharging of the bit lines after the sensing operation was completed.

While the circuitry of the '395 patent functioned satisfactorily in many applications, and had low power drain once the memory cell contents was read, its cross-coupled amplifiers did draw a significant amount of current from the bit lines during the precharging and sensing portions of the memory cycle in order to attain fast operation. It would be advantageous to have a sense amplifier that drew less current from the bit lines and which, accordingly, would offer lower power consumption than that of the '395 patent. It would also be advantageous to reduce the complexity of the overall circuitry by eliminating the need for a separate latch circuit.

SUMMARY OF THE INVENTION

In accordance with the principles of the present invention, in one illustrative embodiment thereof, the speed problem is solved by employing a clock that defines four phases of circuit operation instead of relying on self-clocking circuit elements, while the power conservation problem is solved by a sense amplifier arrangement which the period of time during which the read current is taken from the bit lines by the sense amplifier.

In particular, the time is minimized during which cross-coupled sense amplifiers are permitted to draw current from the bit lines when the memory cells are being read during the memory cycle. In addition, the duration of the current path from the bit lines through the cross-coupled amplifiers to ground (which lasted throughout the "SELECT" waveform of the '395 patent) is restricted so that it is only present during a short portion of the SELECT interval which, in accordance with the present invention is termed the evaluate interval ("EVAL") and not during the precharge interval. Further economies are realized by circuit changes which allow the sense amplifiers to perform the function of the separate latch generator required in the '395 patent.

Further in accordance with our invention, the memory cycle is divided into four distinct phases ("PRECHARGE", "SENSE", "EVAL", and "HOLD"), instead of the two phases ("clock" and "select") followed by indeterminate length self-timed intervals as provided in the '395 patent.

BRIEF DESCRIPTION OF THE DRAWING

The foregoing and other objects and features of the present invention may become more apparent by referring now to the drawing in which.

GENERAL DESCRIPTION

Figure 1:
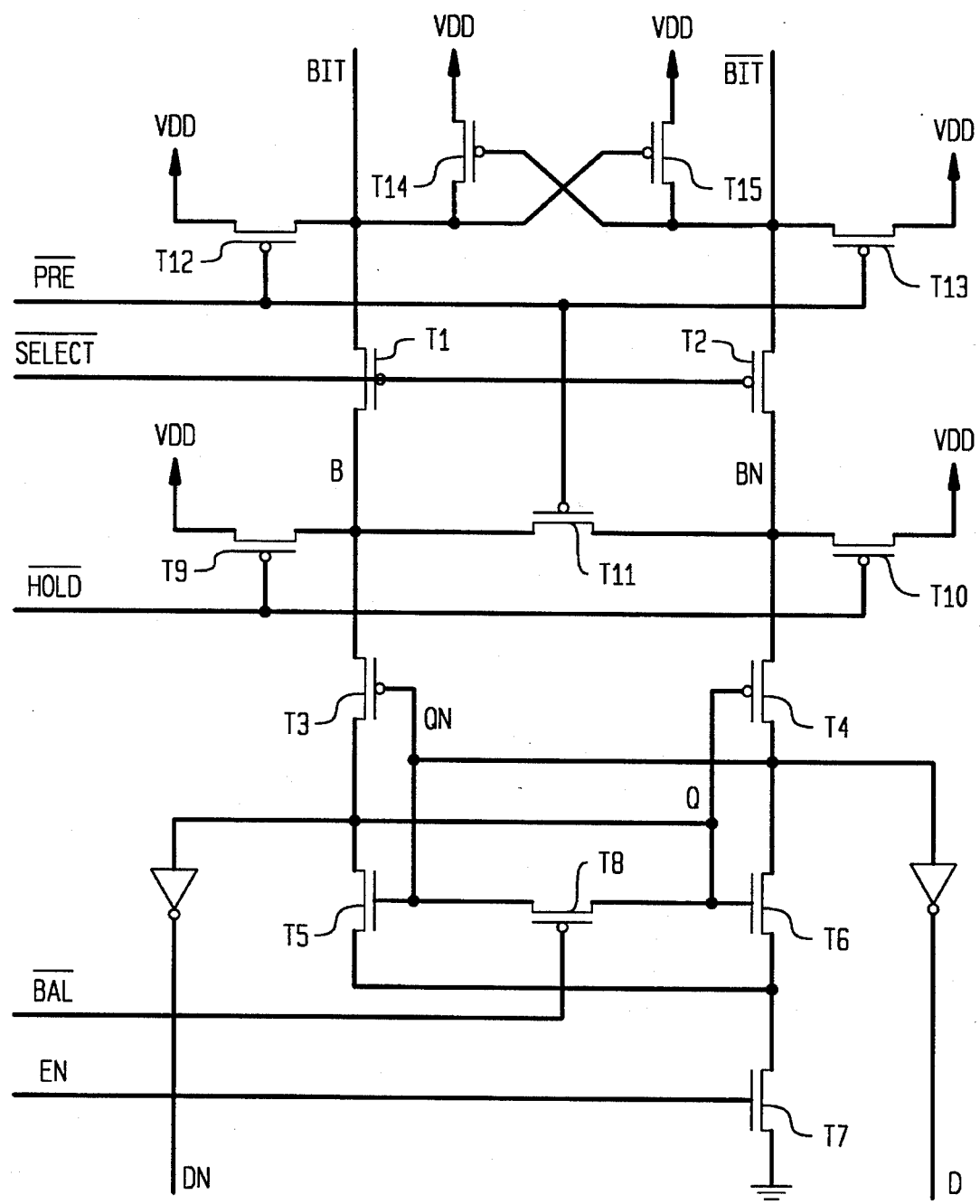
FIG. 1 is a schematic diagram of the sense amplifier circuitry of the invention.
Figure 2:
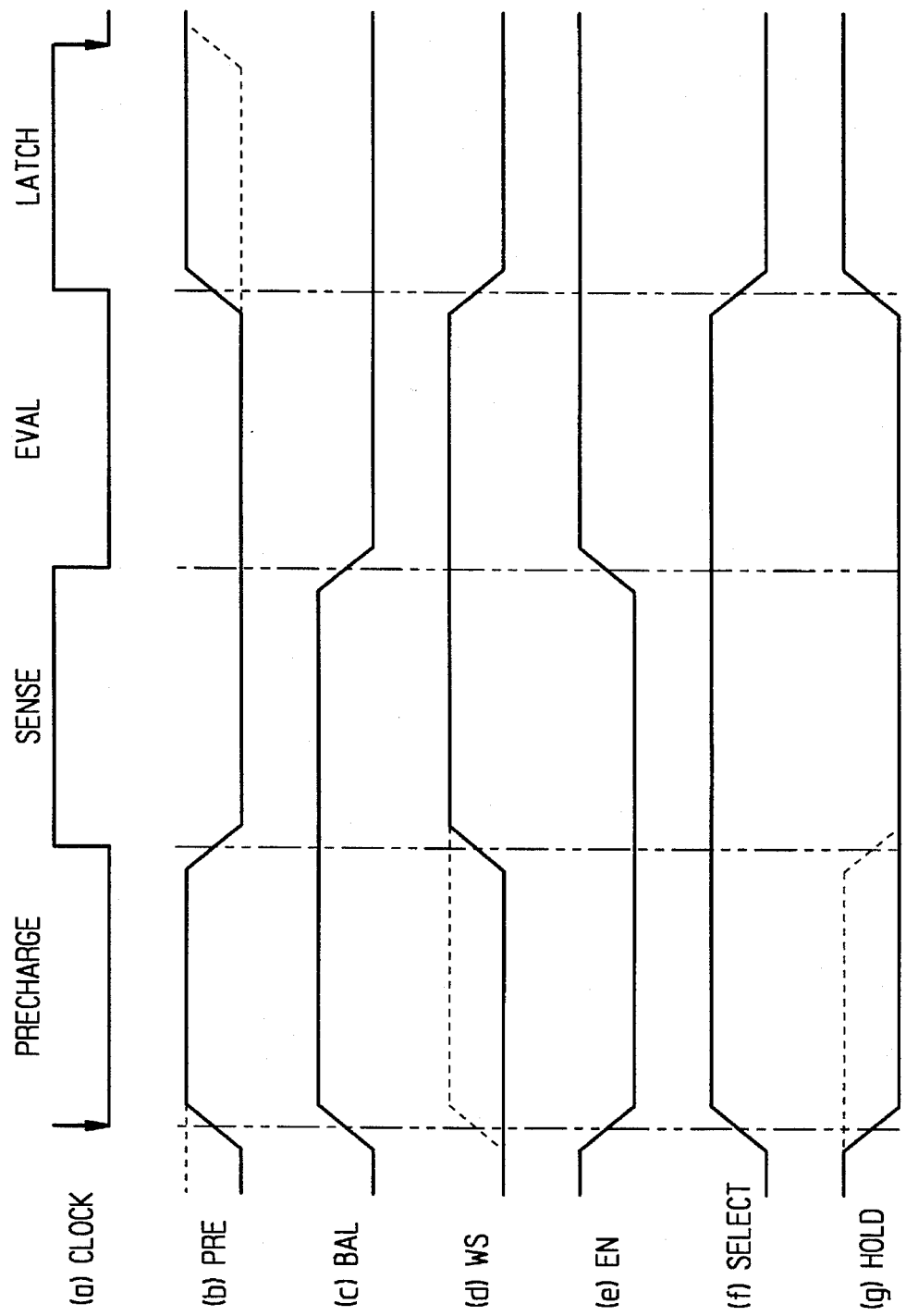
FIG. 2 shows the waveforms controlling the operation of the circuit of FIG. 1.
Figure 3:
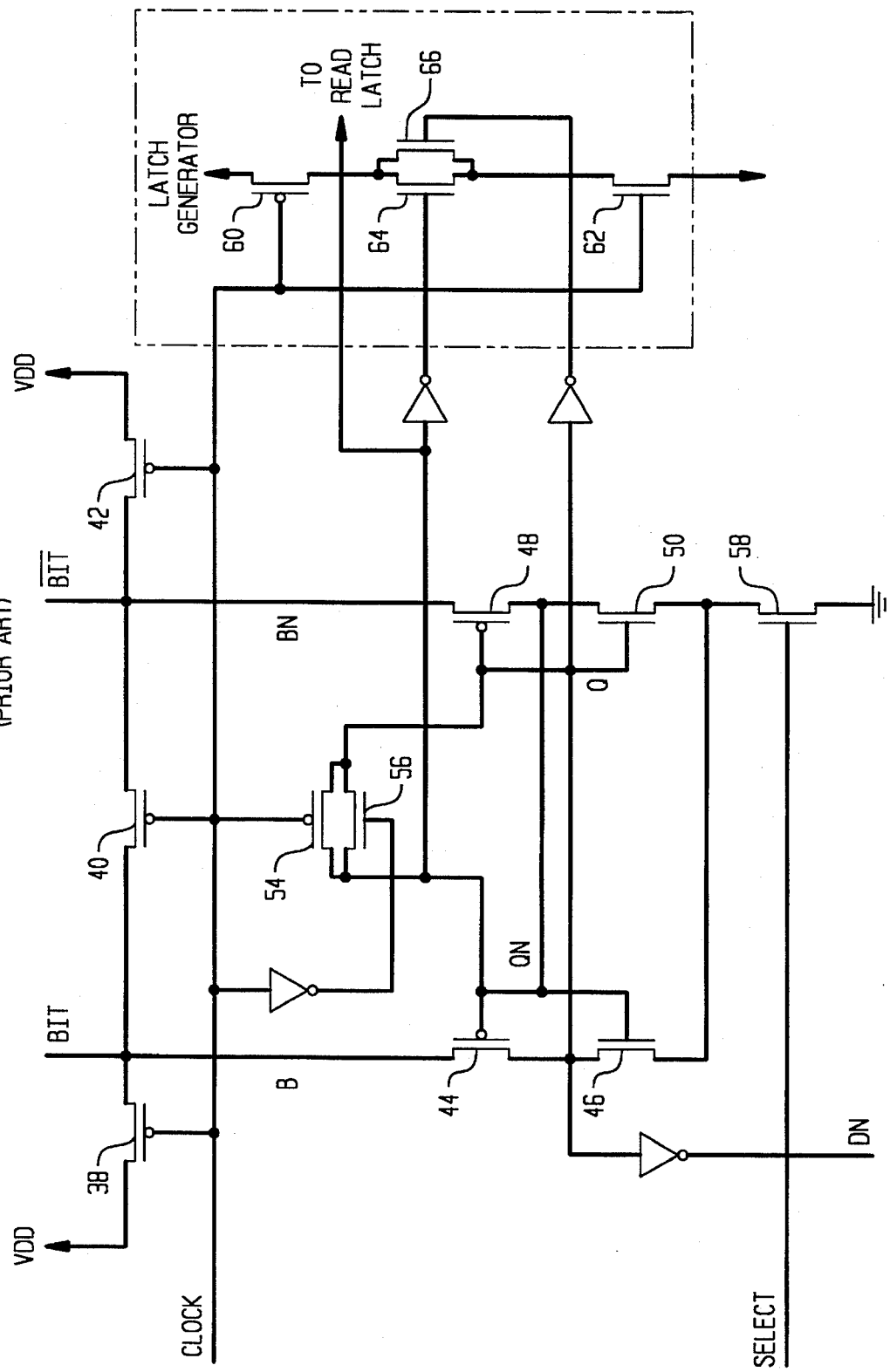
FIG. 3 shows the circuitry of the prior art '395 patent, redrawn for purposes of comparison with the circuitry of FIG. 1.

The circuitry of FIG. 1 will be described with respect to the waveforms shown in FIG. 2. In FIG. 2 the convention is employed which shows the waveforms high when in their active state. In FIG. 1 the convention is employed which uses an overhead bar with the waveform designation to indicate that the waveforms is, in fact, active low. Referring to the top of FIG. 1, bit lines BIT and $\overline{\text{BIT}}$ lead to a particular memory cell (not shown) of the same type of memory array (not shown) discussed in the '395 patent.

The circuitry of FIG. 1 operates under control of the four-phase CLOCK waveform shown in FIG. 2(*a*) which controls the start and end of each of the waveforms of FIGS. 2(*b*) through 2(*g*). The circuitry of FIG. 1 is called into operation to access the memory array by the SELECT waveform, shown in FIG. 2(*f*), which remains active throughout the following three phases labelled PRECHARGE, SENSE, and EVAL. The SELECT waveform activates transistors T1 and T2 which remain conducting through the PRECHARGE, SENSE and EVAL phases. All of the transistors in FIG. 1 are P-channel enhancement transistors, except transistors T5, T6 and T7 which ar N-channel enhancement transistors.

THE PRECHARGE PHASE

During the PRECHARGE phase identified in FIG. 2, waveforms PRE, FIG. 2(*b*) and BAL, FIG. 2(*c*), are high (i.e., active low in FIG. 1), while waveforms EN, FIG. 2(*e*), and HOLD, FIG. 2(g), are low (i.e., inactive high in FIG. 1). Waveform PRE in FIG. 2(b) activates transistors T12 and T13 which initialize the bit lines to the potential of the supply $V_{dd}$. Transistors T3 and T5 form a non-inverting amplifier for responding to the information storage state of the bit line BIT while transistors T4 and T6 form an inverter amplifier for responding to the information storage state of the bit line BIT BAR. Transistor pair T3, T5 will hereinafter sometimes be referred to as one of the pair of sense amplifiers while transistor pair T4, T6 will be referred to as the other of the pair of sense amplifiers. During this PRE-CHARGE phase, the source terminals of the transistors T3 and T4 of both of the sense amplifiers are connected together by balancing circuit transistor T11 thereby ensuring negligible voltage difference between these terminals at the end of the PRECHARGE phase.

Also during the PRECHARGE phase, the BAL waveform shown in FIG. 2(c) activates balance circuit transistor T8 to clamp together the gate terminals of transistors T3, T4, T5 and T6. (Transistor T8 will remain conducting during the subsequent SENSE phase, as well.) At the same time that the BAL waveform is active, the EN waveform shown in FIG. 2(e) is inactive, maintaining the gate of transistor T7 at a potential to keep this transistor in a non-conducting condition. Keeping transistor T7 non-conducting isolates the sense amplifiers from ground so that they cannot provide a current path to ground for the bit lines. So long as transistor T7 remains nonconducting, the source terminals of the transistors in the sense amplifiers track the potential on the bit lines but the transistors dissipate no power. During PRECHARGE, transistors T14 and T15, which are connected to the bit lines, are both off. These transistors will come into operation when the potential of one of the bit lines begins to fall after the termination of the PRECHARGE interval.

THE SENSE PHASE

During the SENSE phase, the BAL waveform remains active. The WS waveform, FIG. 2(d), becomes active, selecting a word line linking a column of memory cells in the array (not shown, but similar to the word line described in the '395 patent). The PRE waveform of FIG. 2(b) becomes inactive, turning off transistors T12 and T13 and ending the PRECHARGE interval. The termination of the PRECHARGE interval allows the bit lines to assume the potential dictated by the information stored in the memory cell to which they are connected. The potential of one of the bit lines will begin to fall. During this time one of the cross-coupled sense amplifiers has its source tracking the falling bit line but, unlike the '395 patent, there is no path to ground from 10 the bit lines through the sense amplifiers because transistor T7 is still in a non-conducting state. The gates Of the transistors of the sense amplifiers are still connected together by transistor T8 under the control of the BAL waveform. When the potential of one of the bit lines begins to fall it, for example the bit line BIT, transistor T14 connected to that bit line causes transistor T15 whose drain is connected to the opposite bit line to turn on, clamping that bit line high and preventing both bit lines from falling.

THE EVAL PHASE

During this phase the WS waveform remains active. The BAL waveform becomes inactive while the EN waveform becomes active. The inactive state of the BAL waveform renders transistor T8 non-conducting thereby ending the balancing of the gates of the transistors of the sense amplifiers. At the same time the active phase of the EN waveform causes transistor T7 to complete a current path to ground from the bit lines through the sense amplifiers. The sense amplifiers quickly assume the state corresponding to the bit line that has fallen in potential somewhat. During this phase the bit line continues to fall as driven by the memory cell. This is the only phase during which the sense amplifiers draw current from any of the bit lines. The current stops when a stable state is reached.

THE LATCH PHASE

During this fourth phase, the HOLD waveform becomes active, turning on transistors T9 and T10 and connecting the sense amplifier terminals B and BN to the potential source $V_{dd}$. This latches the data in the sense amplifiers with no power dissipation. During this phase the SELECT waveform becomes inactive thereby turning off transistors T1 and T2 and disconnecting the memory bit lines from the sense amplifiers. The WS waveform goes to its inactive phase as well to save power by stopping the memory bit line from being pulled any lower. This fourth phase ends when the PRECHARGE signal becomes active to start the next cycle (or to idle the memory). The PRECHARGE signal can remain high until the next read cycle begins when SELECT rises and HOLD falls.

The WRITE phase, during which information may be entered into the memory cell by circuitry (not shown herein, but described in the '395 patent) which impresses state-defining differential voltages on the bit lines, may occur during or following the LATCH phase since the sense amplifiers are then disconnected from the bit lines.

THE OPERATION OF THE '395 PATENT COMPARED

In the '395 patent, the SELECT signal causes transistor 58 to conduct, thereby completing a path to ground for the bit lines through the sense amplifiers and allowing them to draw current from the bit lines throughout the remainder of the memory access cycle. The intervals $t_1-t_2$ and $t_2-t_3$ are self-timed, i.e., determined by analog circuit parameters. The duration of the latter interval is determined by the voltage difference between the bit lines. This period could be quite short, unless there was little voltage difference between the bit lines and there would be little voltage difference if the self-timed interval, $t_1-t_2$, were short. Accordingly, the shortening of one of the intervals causes a lengthening of the other. In contrast, the circuit of our invention allows a full half-cycle for the SENSE phase to take place, typically resulting in a significant voltage differences. Since our circuit allows a significant voltage difference to accrue, the evaluation of the state of the bit lines by the sense amplifiers during the EVAL phase occurs quite rapidly. However, since the EVAL phase is not self-timed, the entire halfl0 cycle of the EVAL phase can be devoted to allowing the sense amplifiers to settle. As noted above, the sense amplifiers of the '395 patent are allowed to draw current throughout the $t_1-t_4$ interval while in our circuit the sense amplifiers are permitted to draw current from the bit lines only during the EVAL phase and not during the preceding SENSE phase nor during the succeeding LATCH phase.

CONCLUSION

What has been described is deemed to be illustrative of the principles of my invention. Numerous modifications may be made thereto, such altering the start of the waveforms as indicated by the dotted lines in FIG. 2. Other modifications may be made by those skilled in the art without, however, departing from the spirit and scope of my invention.

What is claimed is:

1. A transistor circuit for ascertaining the status of a pair of bit lines threading a memory cell of a synchronous static random access memory during a multi-phase memory cycle, comprising:

means for precharging said bit lines during a first portion of said memory cycle, a pair of transistor amplifiers respective to said bit lines, means for temporarily balancing the state of said pair of amplifiers during a portion of said memory cycle, means for temporarily connecting said pair of amplifiers in circuit with said bit lines during a later portion of said memory cycle to ascertain the respective states thereof, means operative following said later portion of said memory cycle for disconnecting said pair of amplifiers from said bit lines, and means operative incident to the disconnecting of said pair of amplifiers from said bit lines for maintaining said amplifiers in said ascertained states during the remainder of said memory cycle independently of the state of said bit lines.

2. A transistor circuit in accordance with claim 1 wherein each amplifier of said pair of amplifiers includes a transistor having gate, source and drain electrodes, and wherein said means for temporarily balancing the state of said transistor amplifiers comprises a balancing transistor connected between said gate electrodes of said amplifiers.

3. A transistor circuit in accordance with claim 1, wherein said means for temporarily connecting said pair of amplifiers in circuit with said bit lines includes a transistor respective to said bit lines in circuit with a respective amplifier of said pair of amplifiers.

4. A transistor circuit in accordance with claim 3, wherein said respective transistor has its source and drain electrodes in circuit between one of said bit lines and one of said amplifiers.

5. A transistor circuit in accordance with claim 4, wherein said means for temporarily connecting said pair of amplifiers in circuit with said bit lines includes means for driving the gate electrode of said respective transistor.

6. A transistor circuit in accordance with claim 3, wherein said means for precharging said bit lines includes a cross-coupling transistor connected between the respective source electrodes of said pair of amplifiers.

7. A transistor circuit in accordance with claim 1, wherein said means for maintaining said amplifiers in said ascertained states includes a further transistor respective to each amplifier of said pair of amplifiers.

8. A transistor circuit in accordance with claim 7 wherein each said further transistor has its source and drain connected in circuit with the source and drain of each said amplifier of said pair of amplifiers after said amplifiers are disconnected from said bit lines.

9. A method of operating a transistor circuit including a pair of transistor amplifiers respective to a pair of bit lines threading a memory cell of a synchronous static random access memory to ascertain the status of said memory cell, comprising:

defining a multi-phase memory cycle, precharging said bit lines during a first portion of said memory cycle, temporarily balancing the state of said pair of amplifiers during a portion of said memory cycle, temporarily connecting said pair of amplifiers in circuit with said bit lines during a later portion of said memory cycle to ascertain the respective states thereof, disconnecting said pair of amplifiers from said bit lines following said later portion of said memory cycle, and maintaining said amplifiers in said ascertained states during the remainder of said memory cycle independently of the state of said bit lines.

10. A transistor circuit for ascertaining the status of a pair of bit lines threading a memory cell of a synchronous static random access memory during a multi-phase memory cycle, comprising:

means (T11, T12, T13) for precharging said bit lines during a first portion of said memory cycle, a pair of transistor amplifiers (T3/T5, T4/T6) respective to said bit lines for preliminarily tracking the potential on said respective bit lines, means (T8) for temporarily balancing the state of said pair of amplifiers during a portion (BAL) of said memory cycle, means (T7) for temporarily completing a current path from said bit lines through said pair of amplifiers during said portion (EN) of said memory cycle, and means for removing said balancing to enable said amplifiers to ascertain the respective states of said bit lines.

11. A circuit for reading from a selected memory cell of a synchronous random access memory during a multi-phase memory cycle, comprising:

a pair of bit lines for connecting to the outputs of the memory cell, means for precharging said bit lines during first portion of the memory cycle, a regeneratively cross-coupled sense amplifier connected to the bit lines for generating a sensed output indicative of the value stored in the memory cell, means for temporarily balancing the state of said sense amplifier during a second portion of the memory cycle, and means for temporarily connecting said sense amplifier to a source of electrical power following said first and said second portions of the memory cycle to enable said generating of said sensed output.

12. A circuit in accordance with claim 11, wherein said means for temporarily connecting said sense amplifier disconnects said amplifier from said bit lines when said sensed output has been generated.

13. A circuit in accordance with claim 12, further including means operative incident to the disconnecting of said amplifier from said bit lines for maintaining said amplifier in the state ascertained from said bit lines during the remainder of the memory cycle independently of the state of said bit lines.

14. A circuit in accordance with claim 11 including means operable prior to said means for temporarily balancing for temporarily allowing said cross-coupled amplifiers to track the potential on said bit lines during said second portion of said memory cycle.

15. A circuit in accordance with claim 11 wherein said source of electrical power includes said bit lines.

16. A transistor circuit for ascertaining the status of a pair of bit lines threading a memory cell of a synchronous static random access memory during a multi-phase memory cycle, comprising:

means for precharging said bit lines during a first portion of said memory cycle, a pair of transistor amplifiers respective to said bit lines, means for temporarily balancing the state of said pair of amplifiers during a portion of said memory cycle, means for temporarily activating said pair of amplifiers during a later portion of said memory cycle to ascertain the respective states of said bit lines means operative following said later portion of said memory cycle for isolating said pair of amplifiers from said bit lines, and means operative incident to the isolating of said pair of amplifiers for maintaining said amplifiers in said ascertained states during the remainder of said memory cycle independently of the state of said bit lines.

* * * * *